(12) United States Patent
Uzoh et al.

(10) Patent No.: US 7,250,104 B2
(45) Date of Patent: Jul. 31, 2007

(54) METHOD AND SYSTEM FOR OPTICALLY ENHANCED METAL PLANARIZATION

(75) Inventors: Cyprian E. Uzoh, San Jose, CA (US); Homayoun Talieh, San Jose, CA (US); Bulent M. Basol, Manhattan Beach, CA (US); Halit N. Yakupoglu, Corona, CA (US)

(73) Assignee: Novellus Systems, Inc., Phoenix, AZ (US)

( * ) Notice: Subject to any disclaimer, the term of this patent is extended or adjusted under 35 U.S.C. 154(b) by 343 days.

(21) Appl. No.: 10/637,731

(22) Filed: Aug. 8, 2003

(65) Prior Publication Data

US 2005/0029123 A1 Feb. 10, 2005

(51) Int. Cl.
*C25F 3/00* (2006.01)

(52) U.S. Cl. ...................... 205/655; 205/667

(58) Field of Classification Search ............. None
See application file for complete search history.

(56) References Cited

U.S. PATENT DOCUMENTS

| | | | |
|---|---|---|---|
| 4,024,029 A * | 5/1977 | Rain et al. ............ 430/413 |
| 5,807,165 A * | 9/1998 | Uzoh et al. ............ 451/41 |
| 6,074,546 A * | 6/2000 | Sun et al. ............ 205/655 |
| 6,176,992 B1 | 1/2001 | Talieh |
| 6,352,623 B1 | 3/2002 | Volodarsky et al. |
| 6,534,116 B2 | 3/2003 | Basol |
| 6,833,063 B2 | 12/2004 | Basol |
| 6,936,154 B2 | 8/2005 | Basol et al. |

* cited by examiner

*Primary Examiner*—Roy V. King
*Assistant Examiner*—Nicholas A. Smith
(74) *Attorney, Agent, or Firm*—Knobbe, Martens, Olson & Bear, LLP

(57) ABSTRACT

The methods and systems described provide for radiation assisted material deposition, removal, and planarization at a surface, edge, and/or bevel of a workpiece such as a semiconductor wafer. Exemplary processes performed on a workpiece surface having topographical features include radiation assisted electrochemical material deposition, which produces an adsorbate layer outside of the features to suppress deposition outside of the features and to encourage, through charge conservation, deposition into the features to achieve, for example, a planar surface profile. A further exemplary process is radiation assisted electrochemical removal of material, which produces an adsorbate layer in the features to suppress removal of material from the features and to encourage, through charge conservation, removal of material outside of the features so that, for example, a planar surface profile is achieved.

14 Claims, 14 Drawing Sheets

METHOD AND SYSTEM FOR OPTICALLY ENHANCED METAL PLANARIZATION

RELATED APPLICATIONS

FIELD

The present invention generally relates to semiconductor processing technologies and, more particularly, to a method and system to provide radiation assisted material deposition and removal at a surface, edge, and/or bevel of a workpiece, such as a semiconductor wafer.

BACKGROUND

In the semiconductor industry, various processes can be used to deposit and remove conductive materials on the wafers. Deposition techniques include processes such as electrochemical deposition (ECD) and electrochemical mechanical deposition (ECMD). In both processes, a conductor such as copper is deposited on a semiconductor wafer or a workpiece from a process solution, such as an electrolyte, that comes into contact with the surface of the wafer and an electrode. Material removal techniques include chemical etching, electrochemical etching, electrochemical mechanical etching and chemical mechanical polishing.

The term of Electrochemical Mechanical Processing (EC-MPR) is used to include both Electrochemical Mechanical Deposition (ECMD) processes as well as Electrochemical Mechanical Etching (ECME), which is also called Electrochemical Mechanical Polishing (ECMP). It should be noted that in general both ECMD and ECMP processes are referred to as electrochemical mechanical processing (EC-MPR) since both involve electrochemical processes and mechanical action on the workpiece surface.

In one aspect of an ECMPR method, a workpiece-surface-influencing-device (WSID) such as a mask, pad or a sweeper is used during at least a portion of the electrotreatment process when there is physical contact or close proximity and relative motion between the workpiece surface and the WSID. Descriptions of various deposition and etching methods, including planar deposition and planar etching methods i.e. ECMPR approaches and apparatus, can be found in U.S. Pat. No. 6,176,952 entitled "Method and Apparatus For Electro Chemical Mechanical Deposition", and U.S. Pat. No. 6,534,116 entitled "Plating Method and Apparatus that Creates a Differential Between Additive Disposed on a Top Surface and a Cavity Surface of a Workpiece Using an External Influence, both commonly owned by the assignee of the present invention.

Regardless of the deposition or removal process used, conventionally the workpiece is transferred to some type of cleaning and drying station after processing. During the cleaning steps, various residues generated by the processing are rinsed off the workpiece, and subsequently the workpiece is dried by spinning and if necessary blowing a gas such as nitrogen on its surface.

In one exemplary design, the processing chamber, in which conventional plating or removal processing or ECMPR occurs, and the rinse chamber can be stacked vertically in a vertical process chambers arrangement. In this arrangement, the processing can be performed in a lower chamber, and the cleaning and drying can be carried out in an upper chamber after isolating the upper chamber from the lower chamber so that chemicals used in either chamber do not mix with each other. One such vertical chamber is disclosed in U.S. Pat. No. 6,352,623 entitled "Vertically Configured Chamber Used for Multiple Processes", commonly owned by the assignee of the present invention.

Conventional electroplating methods for depositing metals such as copper in damascene and non-damascene type structures typically produce a metal deposit with topographic profiles. FIG. 1 illustrates a cross-sectional view of a surface region of an exemplary workpiece 102 such as a semiconductor wafer with topographic features 104 such as trenches and vias formed into the insulating, or dielectric, layer 110 of the workpiece 102. In conventional deposition processes, a barrier layer 108, and then, in the case of copper deposition, a very thin copper, copper alloy or non-copper seed layer 112 are coated onto the insulating layer 110 and into the features 104.

Metal deposition onto the workpiece 102 having features such as features 104 generally produce a thick overburden or excess metal layer. The top surface of the overburden metal layer is usually conformal with the deepest and widest features. As shown in FIG. 2, copper is deposited onto the wafer 102 to form a copper layer 106. Typically, the goal of a planarization process is to remove the metal from the top surface of the wafer 102, leaving the metal only in the features 104. This is presently achieved by a polishing technique such as chemical mechanical polishing (CMP) as well as ECP or ECMP processes as referred to above, or a combination of these techniques.

With a patterned wafer 102 that has features 104, the copper when deposited onto the wafer 102 will tend to align to the features 104, leaving valleys 114 in a top surface 116 of the copper layer 106. In most commonly used CMP approaches, the surface of the workpiece 102 is contacted with a polishing pad and the pad is moved with respect to the surface. The role of the pad is to polish the surface of the workpiece 102 and to remove the copper on the surface with the help of, for example, a chemical solution or slurry containing abrasive particles. When CMP techniques are used to remove a portion of the metal layer, resulting in the planarized workpiece 102 shown in FIG. 3, the dielectric layer 110 of the workpiece 102 receives uneven pressure from a polishing tool due to the valleys 114 in the copper layer 106 in FIG. 2. Further, the force from the CMP polishing pressures can locally exceed the fracture strength of the dielectric, or any of the metal-dielectric interfaces. This, in turn, may result in defects such as cracks in the dielectric layer or delamination at the interfaces of dissimilar materials such as interfaces of dielectric and copper or barrier layer and dielectric layer, etc. Such defects lowers the overall process yield and productivity. For this reason, fragile insulators and many low-k films forming the dielectric layer 110 are easily damaged during CMP operations on metals 106 such as copper.

This damage can be seen as cracks 118 in the dielectric layer as exemplified in FIG. 4 that shows the cross-section of the same workpiece 102 after, for example, a CMP technique has been applied beyond the planarization achieved in FIG. 3. As the excess copper and the barrier layer 108 outside the features are removed in order to fully isolate the structures of interest, the dielectric layer 110 of the workpiece 102 is damaged and defects such as cracks 118 are formed.

FIG. 5 illustrates an exemplary workpiece 152 having a very deep trench 166a and a via 166b into the dielectric layer 160 over the barrier layer 158 and the seed layer 162. In deep to very deep trench plating applications, the depth of the features 166 of interest may range from 3 to 100 microns, while the width of the features 166a, 166b may range from below 1.5 micron to above 100 microns. In FIG. 5, the depth of the trench 166a is approximately 30 microns, while the widths of the trench 166a and the via 166b are approximately 200 microns and 10 microns, respectively. Of course, these exemplary dimensions of FIGS. 5 and 6 are presented for purposes of illustration, and the application of FIGS. 5 and 6 to other dimensions will be readily understandable to one skilled in the art.

The exemplary workpiece 152 presents a unique difficulty for conventional damascene plating processes. For example, performing conventional damascene plating on the 30 micron deep trench 166a would result not only in very long plating times, but the CMP process to polish over 30 microns of a copper layer 156 would be very expensive. For instance, a 30 micron deep feature may require about 500 nm seed layer 162. Typically, about 35 microns of plate copper would be needed to deposit on the workpiece 152, as shown in FIG. 6. The removal of this large overburden layer 156 by CMP process, or by other methods, will be quite expensive.

Avoiding damage to fragile dielectric films on workpieces and substrates presents a challenge for state of the art CMP techniques. The higher the polishing pressure, the higher the metal removal rates are during CMP operations. Higher polishing pressures, while practical for strong dielectric films, are problematic for many films with low dielectric constants, let alone porous dielectrics. This is because these films tend to be more fragile than, for example, silicon dioxide. In general, CMP operations that occur at low pressures do minimize the damage to fragile dielectrics, but the operations result in lower metal removal rates, hence lower process throughput and higher operating costs.

The ECMD and ECMP techniques referred to above, or a combination thereof, are often successful in obtaining a planar conductive surface over what had previously been a non-planar conductive layer, as described, for example above mentioned in U.S. Pat. No. 6,176,992. While usage of an ECMD process or an ECMD/ECMP process is advantageous, having other techniques that can assist or supplement these and other processes to provide planarization is desirable.

In addition to the challenges posed by metal overburden on workpieces having topographical features, when a metal such as copper is plated on a wafer front surface, in addition to areas on the front surface where there are ICs, the copper may also deposit on the edges and sides, i.e., bevel, of the wafer where no ICs or circuits are located. In some cases, the edge and bevel are protected from the plating solution; therefore no copper may be plated there. However, there may still be a copper seed layer on the edge regions and bevel. Whatever the source is, such remaining copper, i.e. the edge copper, may migrate to neighboring active regions from the sides and edges of the wafer, especially during an annealing step. Further, copper particles originating from a wafer edge may contaminate the wafer transport system, and other process equipment such as the annealing system etc., and so be passed on to contaminate other wafers. Poorly adhering copper flakes from the wafer edge may also cause problem during the CMP step by becoming loose and getting onto the surface areas where there are circuits. For these reasons and more, it is important to remove the copper from the edges and the bevel of the wafer following each copper plating process step.

Thus, there is a need in the semiconductor industry for systems and processes that allow for more efficient processing, including further techniques to planarize workpiece surfaces and to provide more precise control of deposition and removal processes while preserving the structural integrity of the dielectric layer and reducing operational costs, and to assist with the removal of, and to inhibit formation of, excess copper from the edges and bevel of a workpiece such as a semiconductor wafer.

SUMMARY

The present invention advantageously provides a method and system for radiation assisted material deposition, removal, and planarization at a surface, edge, and/or bevel of a workpiece, such as a semiconductor wafer, packaging substrates, flat display panels.

Exemplary processes according to aspects of the present invention performed on a workpiece surface having topographical features include radiation assisted electrochemical material deposition, which produces a protective or adsorbate layer outside of the features to suppress deposition outside of the features and to encourage, through charge conservation, deposition into the features to achieve, for example, a planar surface profile or a super leveling deposition in the large features. A further exemplary process is radiation assisted electrochemical removal of material, which produces an adsorbate layer in the features to suppress removal of material from the features and to encourage, through charge conservation, removal of material outside of the features so that, for example, a planar surface profile is achieved.

DETAILED DESCRIPTION

The present invention, as described hereinafter, advantageously provides for radiation assisted material deposition, removal, and planarization at a surface, edge, and/or bevel of a workpiece, such as a semiconductor wafer.

It should be noted that the present invention can be used in any electrochemical metal deposition or removal system or chamber, including electrochemical process systems, electrochemical mechanical process systems and chemical systems. The embodiments herein described, including the process solution container structure and use of ECMD and ECMP processes, are given here only by way of example.

Figure 1:
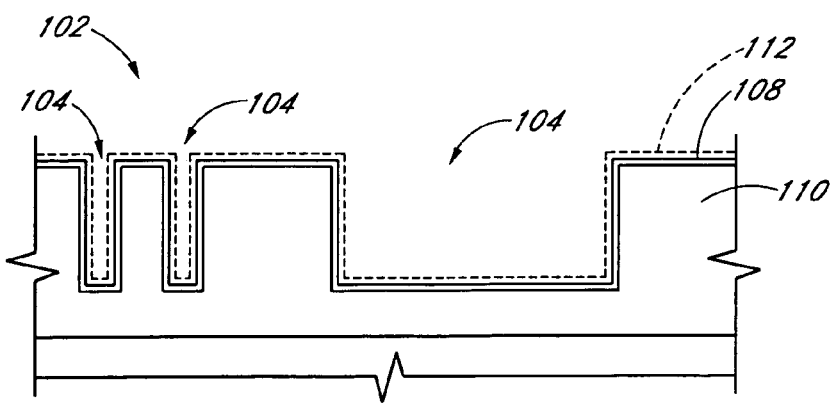
FIG. 1 illustrates a cross-sectional view of an exemplary workpiece prior to deposition of metal onto the top surface and into the features of the workpiece.
Figure 2:
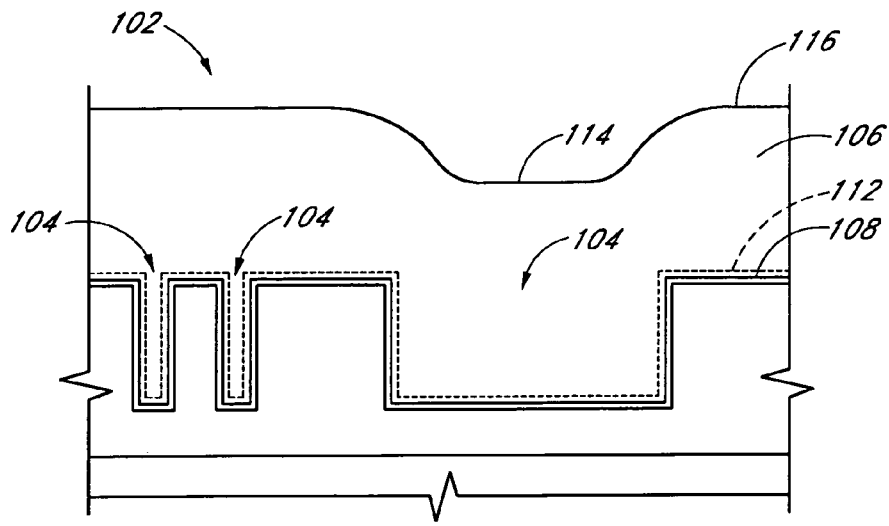
FIG. 2 illustrates a cross-sectional view of the exemplary workpiece of FIG. 1 with metal overburden deposited onto the top surface.
Figure 3:
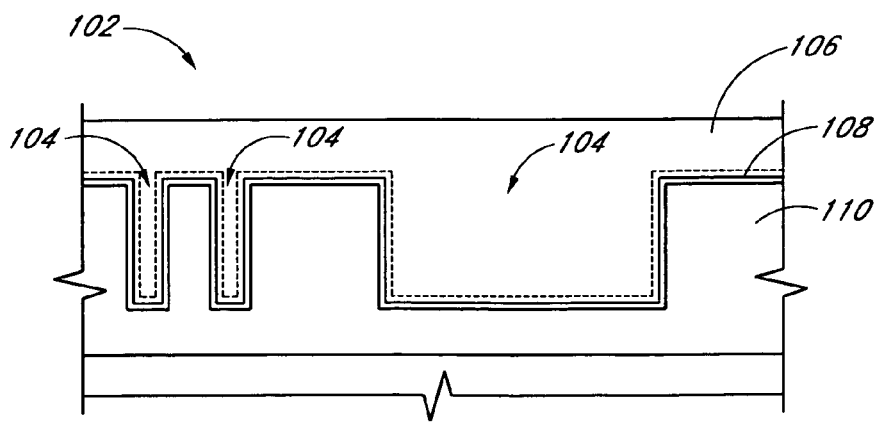
FIG. 3 illustrates a cross-sectional view of the exemplary workpiece of FIG. 2 following planarization.
Figure 4:
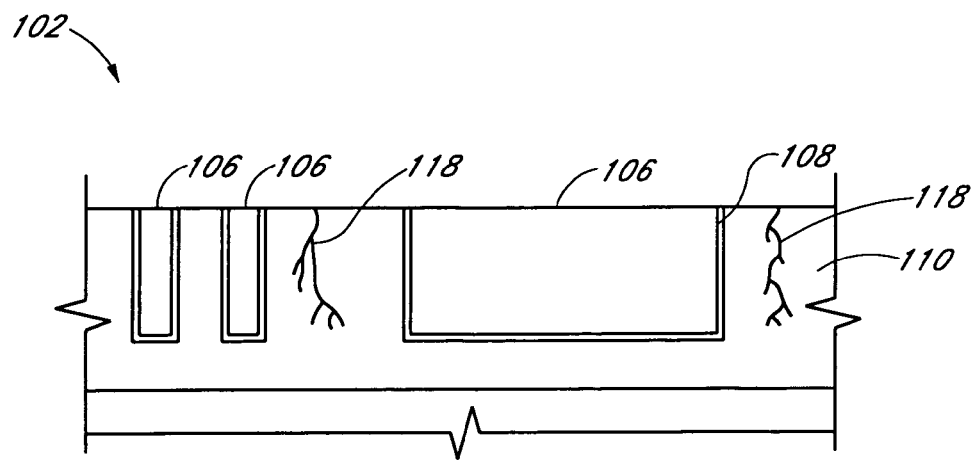
FIG. 4 illustrates a cross-sectional view of the exemplary workpiece of FIG. 3 following further removal of the metal overburden.
Figure 5:
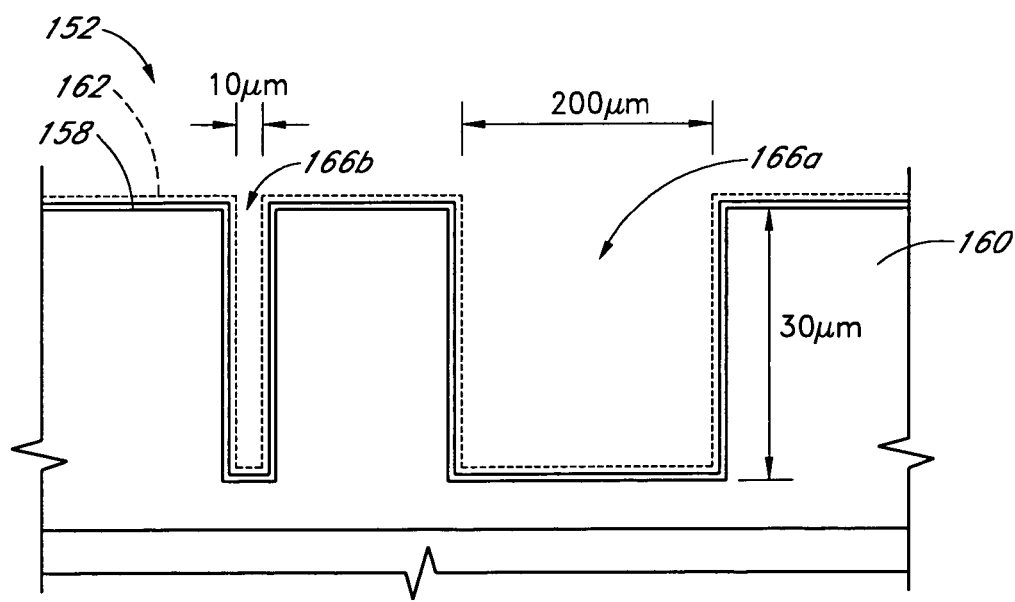
FIG. 5 illustrates a cross-sectional view of an exemplary workpiece prior to deposition of metal onto the top surface and into the features of the workpiece.
Figure 6:
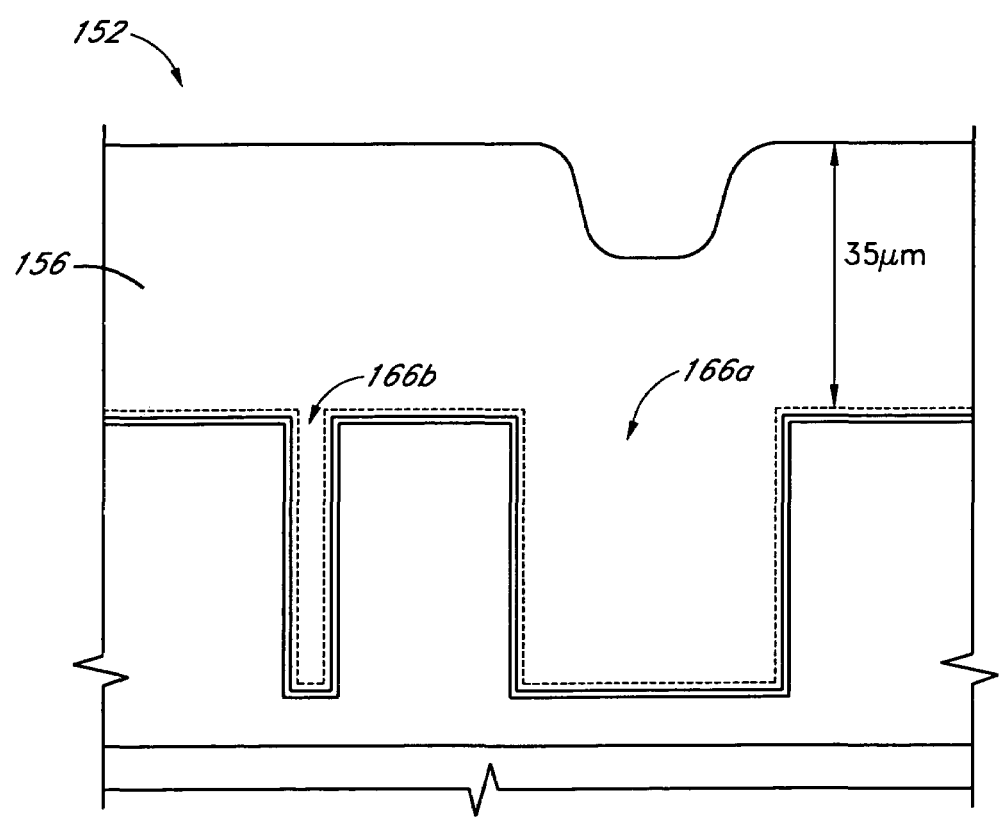
FIG. 6 illustrates a cross-sectional view of the exemplary workpiece of FIG. 5 with metal overburden deposited onto the top surface.
Figure 7:
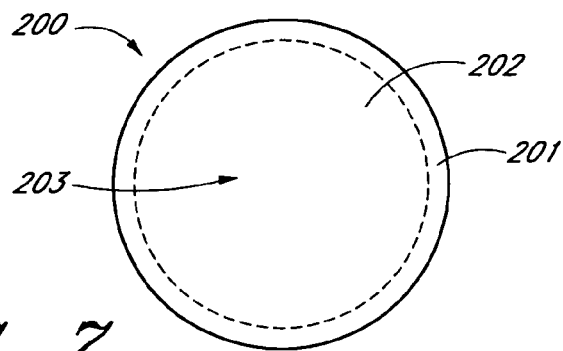
FIG. 7 illustrates an exemplary wafer on which is operated on according to the present invention.
Figure 8:
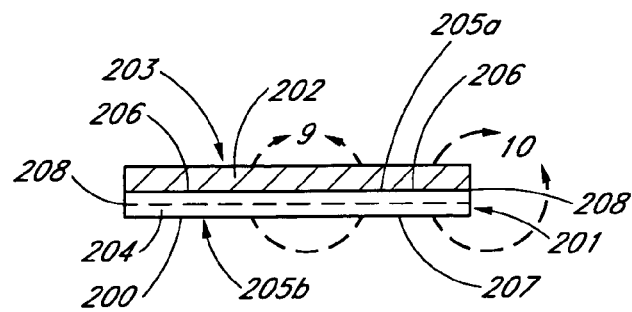
FIG. 8 illustrates a cross section of the exemplary wafer of FIG. 7.

Reference will now be made to the drawings wherein like numerals refer to like parts throughout. FIG. 7 is a top plane view of a plated workpiece 200 such as a semiconductor wafer. As also shown in FIG. 8 in side view, the plated wafer 200 comprises a top layer 202 having a top or front surface 203 and a bottom layer 204 having an upper surface 205a and a bottom surface 205b. The top layer 202 is formed on the upper surface 205a of the bottom layer 204. A top surface edge portion 206 of the upper surface 205a of the bottom layer 204, a side surface 208 of the bottom layer and a bottom surface edge portion 207 of the bottom layer define an edge region 201 around the perimeter of the bottom layer 204. In this embodiment, the top layer 202 of the plated wafer 200 is comprised of a layer or layers of conductive material, for example copper, and the bottom layer 204 comprises a semiconductor substrate, such as a silicon substrate which may have devices, circuits and interconnect structures already fabricated into it.

Figure 9:
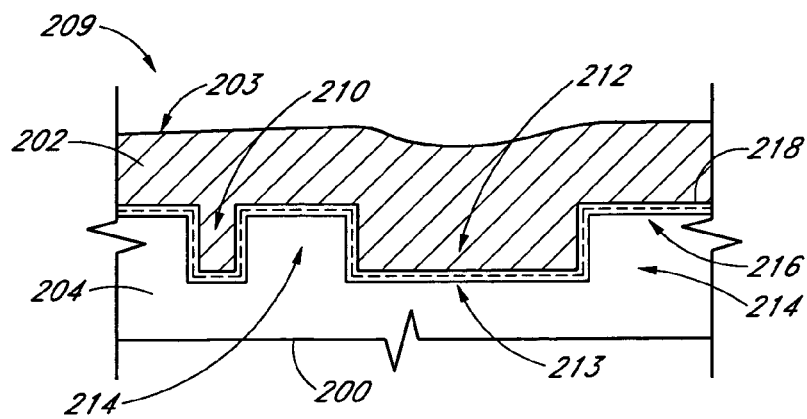
FIG. 9 illustrates a more detailed cross section of a surface portion of the exemplary wafer of FIG. 7.

FIG. 9 is an enlarged partial cross-sectional view of near top surface region 209 of the wafer 200, shown in FIG. 8, which comprises a via and a trench feature 210 and 212 formed in an insulating region 214 which is previously formed on the wafer surface. As shown in FIG. 9, the surface region 209 of the plated wafer 200 may comprise a plurality of via, trench and other features such as dual, triple or multiple damascene features. The features 210, 212 and the surface of the insulator between the features are typically lined with a diffusion barrier/glue layer 216 and a seed layer 218, i.e., a copper seed layer for the case of copper deposition. In most cases, the barrier layer 216 and/or the seed layer 218 extends onto the top surface edge portion 206, and sometimes onto the wafer side 208. In fact, one or both of these layers may wrap around and coat the bottom surface edge portion 207, thereby covering the edge region 201. Since, copper only deposits on the conductive regions that are coated with barrier or copper seed layer or with a barrier/seed composite layer, this may also cause copper to deposit on the edge region 201, if the edge region 201 is exposed to the plating electrolyte. Electroplated copper layer 202 fills the vias 210 and the trenches 212 and forms the copper layer 202 on the substrate 204. Challenges that arise in typical copper deposition overburden onto a substrate having wide or deep topographical features, as described above with respect to workpieces 102 and 152 of FIGS. 1–6, are surmounted and overcome according to aspects of the present invention and described in more detail below.

Figure 10:
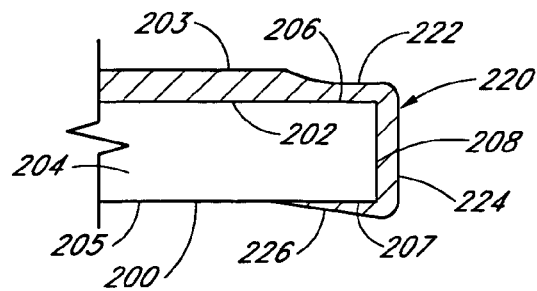
FIG. 10 illustrates a more detailed cross section of an edge portion of the exemplary wafer of FIG. 7.

As mentioned above, the copper layer 202 may also extend onto the edge region 201, thus forming an edge copper 220 shown in FIG. 10. It should be noted that barrier/glue layer is not shown in FIG. 10 and that the edge copper 220 may be as a result of having copper seed layer on the edge region 201, and plating this region with copper when the edge region 201 is exposed to the plating electrolyte during plating. Alternatively, the edge copper 220 may be just the seed layer itself covering the edge region 201, if the edge region is not protected from the plating electrolyte during the plating process using well known sealing means. The edge copper 220 may form around the whole or partial circumference of the wafer 200. As exemplified in FIG. 10, the edge copper 220 may have an upper portion 222, a side portion 224 and a lower portion 226, which are formed on the edge region 201. The edge copper portions 222, 224, 226 can be removed from the edge region 201 by applying, for example, a copper etching solution according to techniques described in U.S. application Ser. No. 10/032,318, filed Dec. 21, 2001, and entitled "Electrochemical Edge and Bevel Cleaning Process and System." The Application describes using, for example, a mild etching solution to electrochemically remove edge (and bevel) copper from workpieces such as semiconductor wafers.

Although in FIG. 10, the edge copper 220 is exemplified using the upper, side and lower portions, it is understood that this is for the purpose of exemplifying the problem; consequently, the unwanted copper may just have the upper portion or just the upper and side portions, etc.

It should be noted that even in the case where copper may not be deposited on the top surface edge portion 206, the side surface 208 and the bottom surface edge portion 205 of FIG. 10 during the plating step, presence of the copper seed layer in those areas may exist and is typically undesirable. In addition, a conventional CMP step, which would often be carried out after the plating step, may be able to remove any copper on the top surface edge portion 206, but would not be effective in removing copper from the side surface 208 and the bottom surface edge portion 207.

From the foregoing challenges emanating from the deposition of thick metal overburden and the presence of metal at the edges as well as the bevel regions, a method and apparatus for depositing planar and non-planar films with very small or minimal overburden on workpieces with trenches and vias using optical and non-optical radiation is provided. In one embodiment, the present invention provides a system and method for depositing materials such as metals on workpieces by employing optical radiation, or other forms of electromagnetic radiation to induce or enhance the deposition of planar film on surfaces with topographical features. Generally, the system of the invention comprises one or more radiation sources and a reflector such as a perforated glass plate or an optically transparent or translucent material with channels through which, for example, process solutions can flow, depending on the embodiment.

Figure 11A:
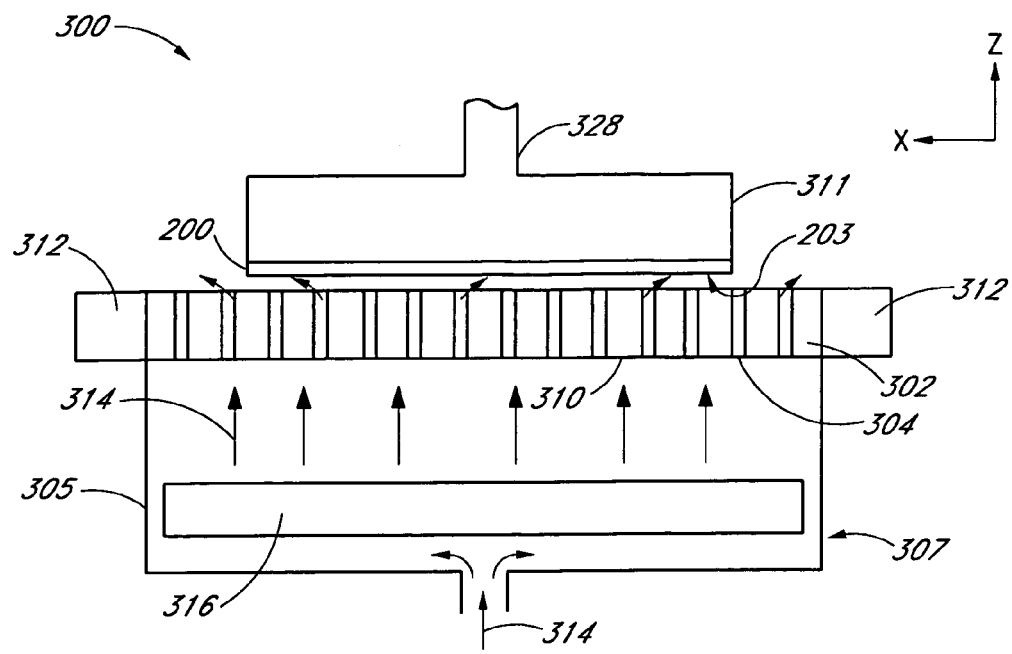
FIGS. 11A–11B illustrate cross-sectional side views of an exemplary radiation assisted ECMPR system according to an aspect of the present invention used for processing workpieces such as wafers.
Figure 11B:
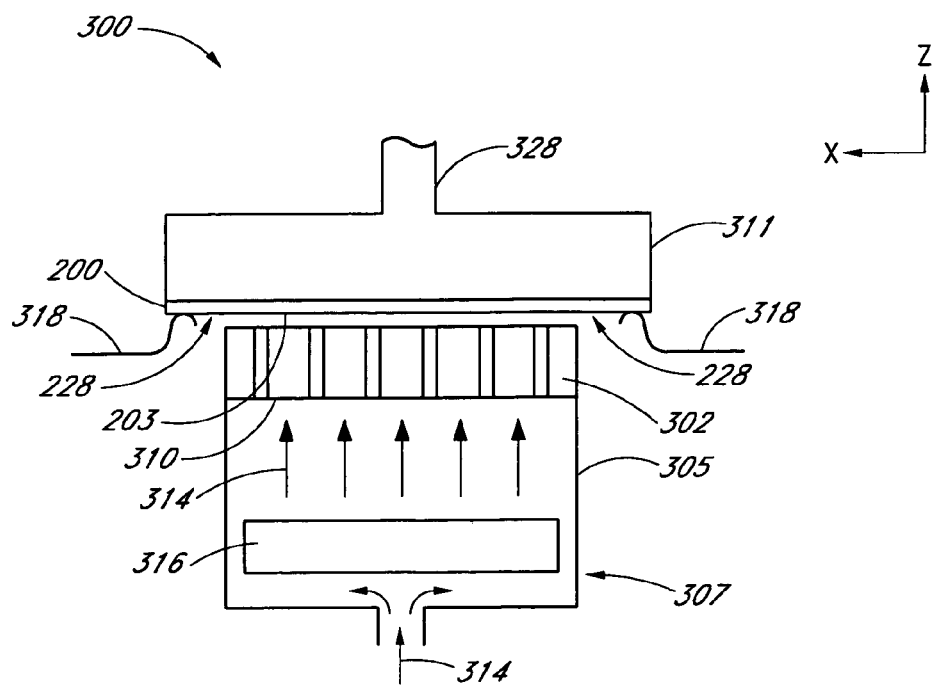

FIGS. 11A and 11B are schematic side views of an exemplary radiation assisted ECMPR system 300 used for processing workpieces such as wafers. For purpose of clarity, the system 300 will be described with reference to, for example, the wafer 200 of FIG. 7, although it is understood that any workpiece may be used as suitable. In FIG. 11A, a workpiece-surface influencing device (WSID) 302 is disposed in close proximity to the wafer 200 which is held by a carrier 311. The WSID 302 preferably has openings 304 in it to communicate radiation and a process solution 314 to a front surface 203 of the wafer 200. In this embodiment, the WSID 302 may be supported by the sidewall 305 of a solution container 307 which also houses an electrode 316. The electrode is an anode if the process is material deposition but it is a cathode if the process is a material removal process. One or more radiation sources 312 may be secured in close proximity to the WSID 302, at the sides of the WSID 302 or on the side walls 305 of the container 307. Although two radiation sources 312 are shown in FIGS. 11A and 11B, it is understood that any number of radiation sources 312, including only a single radiation source, may be used as suitable. Although the one or more radiation sources are preferably placed locally to the WSID 302, in other embodiments, the sources 312 may be located remotely from the container 307 and the WSID 302. For example, optical fiber 330 or optical fiber arrays can be used to couple one or more remotely located radiation sources 312 to the area or areas at which radiation is desired, as shown in FIG. 11D. The one or more radiation sources 312 preferably includes a selectable or tunable wavelength radiation coupler. Although it is not show for purpose of clarity, the system 300 also includes a power supply that is connected to the electrode and the conductive front surface of the wafer. During the process, the power supply (not sown) applies a potential difference between the conductive surface of the wafer and the electrode. The radiation sources and the operation of the radiation sources with regard to radiation assisted ECMPR will be described in more detail below.

Figure 11C:
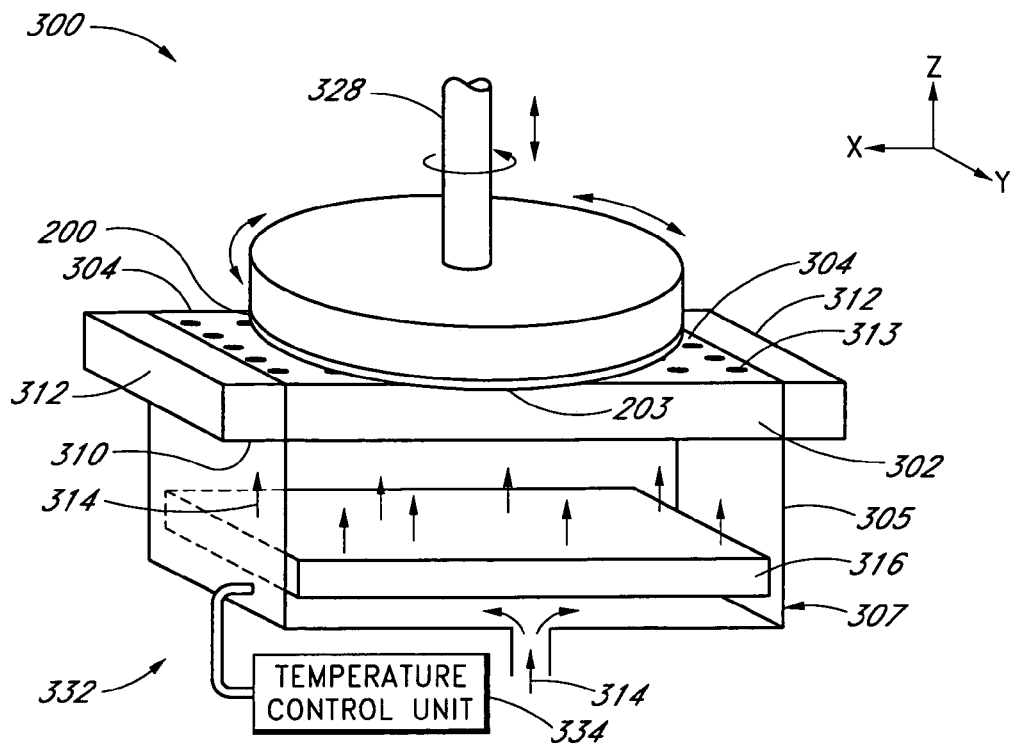
FIG. 11C illustrates a perspective view of the exemplary radiation assisted ECMPR system of FIGS. 11A–11B including an exemplary light-preventing coated chamber and a temperature control unit.
Figure 11D:
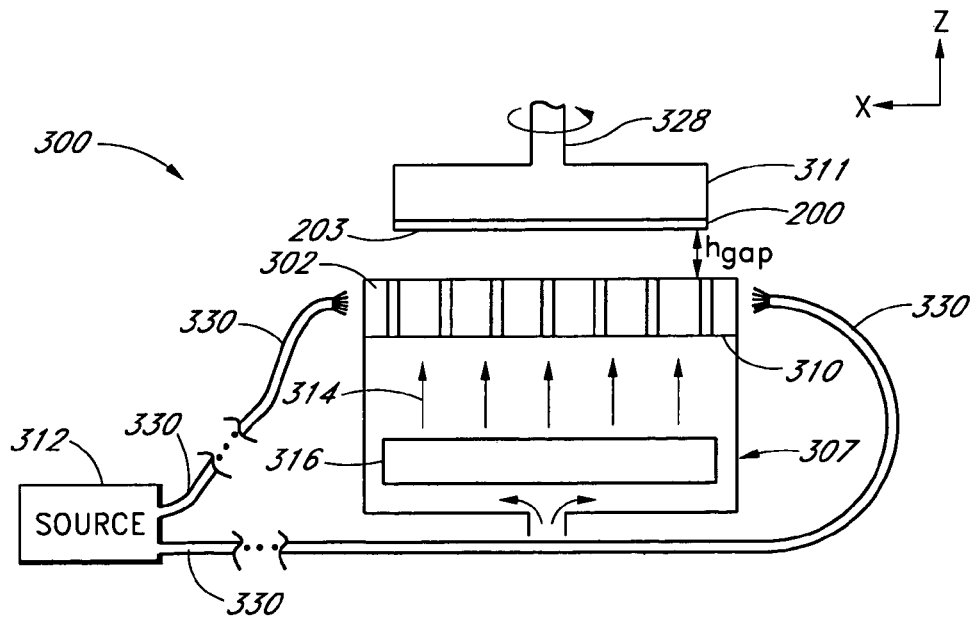
FIG. 11D illustrates a cross-sectional side view of the exemplary radiation assisted ECMPR system of FIGS. 11A–11B using a remote radiation source.

FIG. 11C illustrates a perspective view of the exemplary radiation assisted ECMPR system 300 of FIGS. 11A–11B including an exemplary light-preventing coated chamber 332 and a temperature control unit 334. The chamber 332 is intended to keep light from affecting the radiation assisted ECMPR. In one embodiment, the chamber 332 is an opaque black box that prevents substantially all outside light from entering the box so that substantially the only light present is the light which originates from the one or more radiation sources 312. The temperature control unit 334 is intended to maintain the lower part of the container 307 and the solution 314 therein within a particular temperature range, as described in more detail below.

The wafer 200 may be a silicon wafer to be plated with a conductor metal, preferably copper or copper alloy. As mentioned above, the wafer 200 is retained by the wafer carrier 311 so as to position the front surface 203 of the wafer 200 against a top surface 313 of the WSID 302. The wafer 200 is preferably rotatable and laterally movable relative to WSID 302 by way of the carrier head 311 and a shaft 328 attached to the carrier head 311, as shown in FIG. 11C. The openings 304 are generally designed to assure uniform application of the process solution, depicted by arrows 314, onto the front surface 203. In special circumstances, a specific material thickness profiles on a wafer, such as an edge-thick material profile or an edge-thin material profile, may be desired. In these cases, the openings 304 are designed to yield such specific material deposition or removal profiles. As the name suggests, in edge-thick profile the thickness of the conductive material gets larger going from the center towards the edge of the wafer. In edge-thin profile, the reverse is true.

In any case, the top surface of the WSID 302 facing the front surface 203 of the wafer 200 establishes good solution flow to the front surface 203 for controlled deposition or etching. The process solution 314 is in fluid communication with the electrode 316 and the front surface 203 of the wafer 200 through the openings 304 in the WSID 302. The electrode 316 is made of a copper or copper alloy for ECMD of copper films or the electrode 316 may also be an inert electrode made of, for example, Pt coated Ti or Pt coated Ta particularly in an ECME application. The process solution may be an electrodeposition solution for material deposition and an electropolishing solution for material removal proceces. An exemplary process solution 314 that is particularly usable in ECMD applications of copper or combined ECMD and ECMP applications of copper may be a copper electrolyte solution containing copper ions with additives such as molecules or ions oh accelerators, suppressors, and chloride ions, which are commonly used in the industry. Additionally, required amounts of levelers and other additives may be added as needed, although the ECMD process does not typically need leveler since it does leveling of the deposited film automatically. Leveler may be added, if needed, however, for optimization of other process results such as gap fill, etc. The top surface 313 of the WSID 302 is preferably kept in very close proximity to the front surface 203 of the wafer 200 while an electrical potential is established between the electrode 316 and the front surface 203 of the wafer 200. For electrochemical deposition of planar films in the ECMPR system such as copper, the front surface 203 of the wafer 200 is made more cathodic (negative) compared to the electrode 316, which becomes the anode. For electrochemical polishing in the same ECMPR system, the front surface 203 of the wafer 200 is made more anodic than the electrode 316. For ECMP processing without ECMD, the solution 314 may preferably be an electropolishing solution. Further, material deposition may be performed galvanostatically (with current control) or potentiostatically (with voltage control).

As mentioned above, during ECMPR, an electrical potential is established between the front surface 203 of the wafer 200 and the electrode 316. In order to establish this potential, as shown in FIG. 11B, the front surface 203 of the wafer 200 is connected to a power source (not shown) through contacts 318 touching and sliding on a exposed peripheral region 228 near the edge region 201 of the wafer 200. If the process electroplating the electrode is positively polarized (anode) with respect to wafer surface, and if the process is electropolishing or electroetching, the electrode is negatively polarized (cathode) with respect to wafer surface. In order to expose the peripheral region 228 as the wafer 200 is rotated, in one embodiment, the width of the WSID 302 is kept shorter than the diameter of the wafer 200. The electrical contacts 318 to the front surface may be conductive brushes contacting the perimeter of the wafer while the wafer is moved or rotated. Such electrical contacts are described in U.S. patent application Ser. No. 10/282,930 entitled Method and System to Provide Electrical Contacts for Electrotreating Processes filed Oct. 28, 2002, which is owned assignee of the present application.

WSIDs may have different configurations. WSIDs can be designed as a pad, shaping plate, belt, wand, wiper, sweeper, or other configurations. In FIGS. 11A and 11B, the WSID 302 is preferably a reflector having channels 304. In presently preferred embodiment, the WSID/reflector 302 is a radiation transmitting media such as a glass plate configured to receive electromagnetic radiation from one or more radiation sources 312 and reflect the radiation onto the front surface 203 of the wafer 200. Radiation transmitting media may also be made of a ceramic, polymer or other radiation transmitting material. The WSID/reflector 302 is also preferably configured as a shaping plate to facilitate ECMPR in the presence of, or in the absence of, directed radiation from one or more radiation sources 312. That is, if the radiation sources 312 are turned off, the WSID/reflector 302 preferably performs as a conventional WSID for ECMPR. If one or more of the radiation sources 312 are activated, the WSID/reflector 302 reflects the radiation to the front surface 203 of the wafer 200 while simultaneously communicating the solution 314 to front surface 203 to perform ECMD or ECMP in the presence of applied potential difference. Due to the nature of the radiation assisted ECMPR process, the WSID/reflector 302 preferably has at least a substantially non-abrasive top surface 313. In other embodiments, the surface of the WSID 302 may contain a hard-abrasive material for efficient sweeping of the front surface 203 of the wafer 200. Fixed abrasive pads, which are supplied by companies such as 3M and Rodel and which are commonly used in CMP applications may be used for WSID surfaces.

Figure 12A:
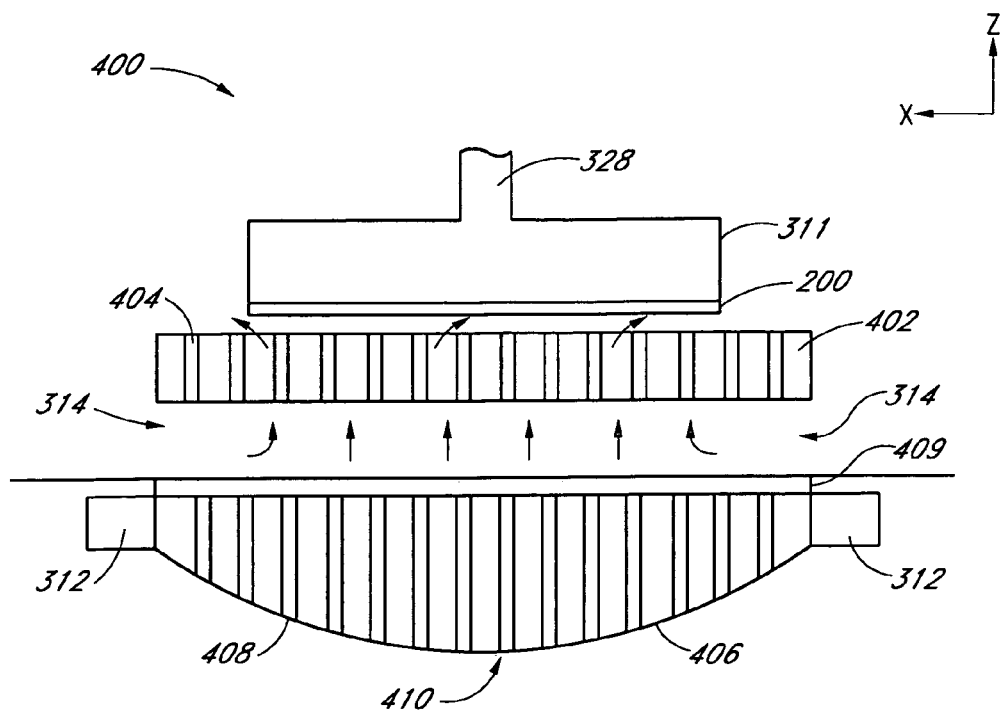
FIG. 12 illustrates a cross-sectional side view of another exemplary radiation assisted ECMPR system according to another aspect of the present invention used for processing workpieces such as wafers.
Figure 12B:
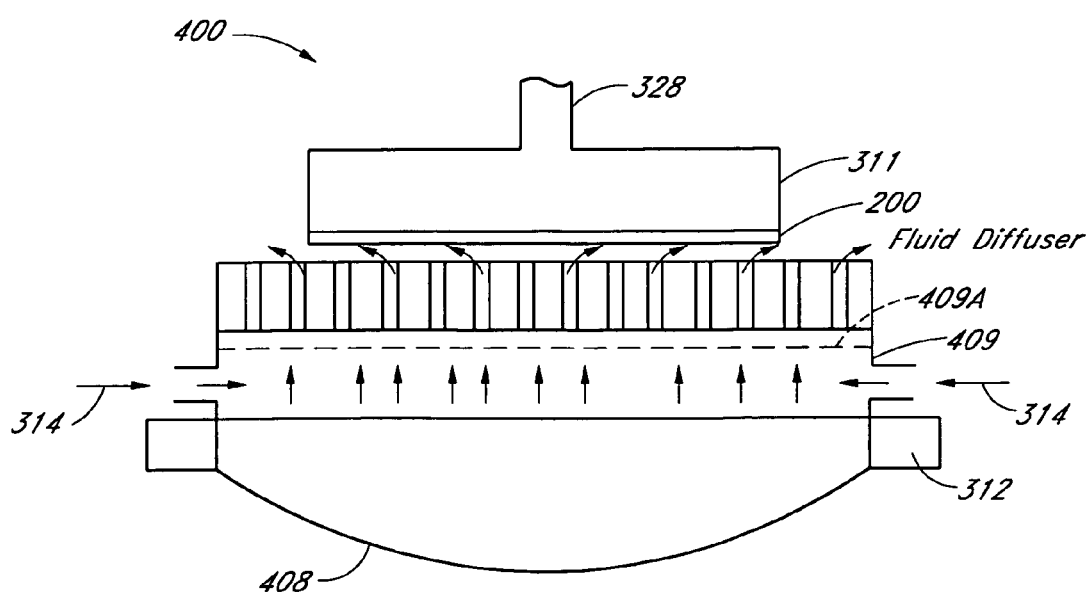

FIG. 12A is a schematic side view of another exemplary radiation assisted ECMPR system 400 used for processing workpieces such as wafers. The system 400 operates similarly to the system 300, except that the system includes a separate reflector 406, which may be a glass plate 406 having perforations or channels 408 and, preferably, a spacer 409 as well as a WSID 402 having openings 404. The WSID 402 may be a conventional WSID 402 used in conventional ECMD and ECMP processes. The spacer 409 is preferably placed below the WSID 402 and above the reflector 406. The lower surface 410 of the reflector 406 in FIG. 12A is preferably convex shaped, rather than flat, so that the radiation from the radiation sources 312 is focused and reflected toward the front surface 203 of the wafer 200. The solution 314 is in contact with an anode (not shown) and flows above the spacer 409, which may be shaped as a ring, and the reflector 406 and is directed through the WSID 402 to the front surface 203 of the wafer 200. The anode may be disposed remotely or below the perforated optical transmitting media 406. Alternatively, as shown in FIG. 12B, the spacer 409 may be adapted to include electrolyte inlet 314 and may have a built in fluid diffuser 409a.

Figure 13A:
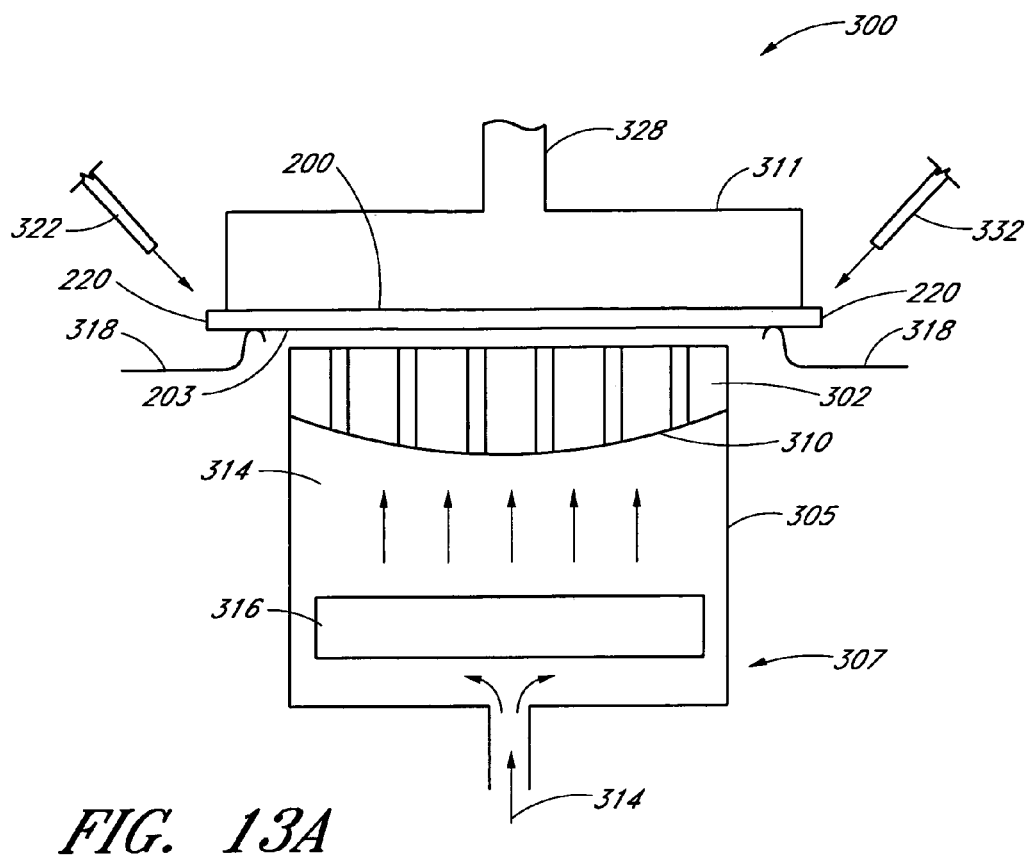
FIGS. 13A–13B illustrate cross-sectional side views of the exemplary radiation assisted ECMPR system of FIG. 11A having a convex shaped reflector and showing radiation assisted edge bevel reduction and removal.
Figure 13B:
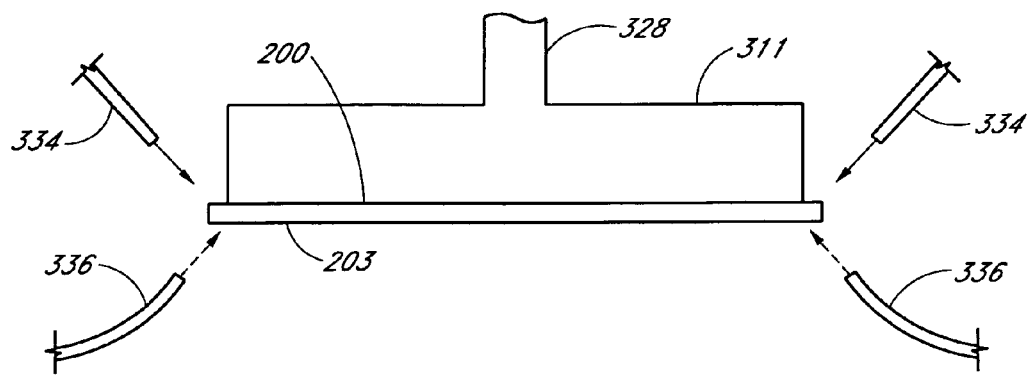

Of course, although the lower surface 310 of the WSID/reflector 302 is flat in FIGS. 11A–11D, the lower surface 310 of the WSID/reflector 302 may be convex shaped as shown in FIG. 13A. The bottom surface of the reflector 302, 406 generally need not be flat, but rather may be curvilinear or convex. The curvature is preferably such that it reflects optimum electromagnetic radiation uniformly across the front surface 203 of the wafer 200 as the wafer 200 rotates and translate laterally with respect to, for example, the WSID 302, 402. FIGS. 13A–13B illustrate cross-sectional side views of the exemplary radiation assisted ECMPR system 300 of FIG. 11A showing radiation assisted edge bevel reduction and removal. Referring to FIG. 13A, during ECMD, one or more additional radiation sources 332 may be used to apply radiation to the wafer 200 minimize growth of the edge copper 220 shown in FIG. 10 and to improve uniformity. The radiation sources 332 may be cycled on and off intermittently so that some edge copper 220 remains for use by the contacts 318. Similarly, referring to FIG. 13B, one or more additional radiation sources 334 may be used to apply radiation to the wafer 200 during an edge bevel removal process that simultaneously applies, for example, a mild electropolishing solution to the wafer 200 using one or more nozzles 336. The edge bevel removal process preferably follows an ECMD plating process. According to one exemplary implementation, FIG. 13A illustrates radiation assisted ECMD occurring in a lower processing chamber portion of a vertical chamber and FIG. 13B illustrates radiation assisted edge bevel removal occurring in an upper rinse chamber portion of the vertical chamber. One such vertical chamber is referred to above and is disclosed in the U.S. Pat. No. 6,352,623. It should be understood that in some embodiments, the one or more radiation sources 312 can be used to provide edge bevel copper growth minimization and removal as well as planarization endpoint detection, as described below, without the introduction of additional radiation sources 332, 334 or the like solely focused on one aspect of wafer 200 copper management.

In the systems 300 and 400 the direction of radiation is from the sides of the WSID/reflector 302 or reflector 406 reflected through to the front surface 203 of the wafer 200. Preferably, the reflectors 302, 406 are coated with a reflective coating, and most preferably at their lower portions, to enhance the amount of radiation that reaches the front surface 203. Most preferably, the reflectors 302, 406 are coated at their lower portions, although the openings 304, 408 may be coated as well as any other suitable portion of the reflectors 302, 406.

The one or more radiation sources 312, 332, 334 may be from xenon arc lamps, which emit intense and relatively stable continuum radiation that extends from wavelengths of 300 to 1300 nm. Further, mercury vapor lamps may be used with filter fluorometers. Radiation from individual mercury emission lines may be used, that occur for instance between 250 to 580 run, including the doublet at 313.2 nm and the triplet at 365.5 nm by use of interference filters. However, phosphor coated bulbs may also be used for a more continuous spectrum.

Other electromagnetic radiation sources 312, 332, 334 may be used. These other sources 312 include, for example, a laser excited source, such as He—Ne laser for a 632.8 nm wavelength source or Ar—Kr laser for argon lines at 488.0 and 514.5 nm and major Krypton lines at 568.2 and 647.1 nm. Also, a tunable $CO_2$ laser for infra-red radiation in the range of 9 to 11 micron may be used. Besides a $CO_2$ laser for infra-red source, for example, a tungsten incandescent lamp may be used for output between 780 and 2500 nm and silicon carbide for radiations below 5 microns and in the far infra-red region beyond 15 microns. Of course, these radiation sources are exemplary, and other sources may be used in accordance with the principles of the present invention.

Although various embodiments of the radiation assisted ECMPR systems 300, 400 and variations thereof have been described, for purposes of illustration the description will focus on the ECMPR system 300.

For ECMD copper plating performed in the absence of radiation from the one or more radiation sources 312, a suitable additive copper plating chemistry may be used.

During such copper deposition, plating current densities ranging between 0.5 to 2000 mA/cm² may be applied to the wafer 200, while the wafer 200 may rotate between 2 to 300 rpm, but preferably between 10 to 180 rpm, while translating laterally with respect to the WSID/reflector 302. The translation range may vary between 0 to 80 mm preferably between 0 to 60 mm, with a lateral velocity between 0 to 100 mm/s, most preferably between 2 to 60 mm/s. Electrolyte flow through the openings or channels 304 in the WSID/reflector 302 may range between 2 to 30 Liters per minute (L/min), depending on the size of the exemplary wafer 200. For example, for a 200 mm wafer, the electrolyte flow rate may range between 4 to 13 L/min, while for a larger wafer, the electrolyte flow rate may be larger. A soluble or inert electrode 316 may be used as necessary, while additional ECMPR features such as additive monitoring and control means, electrolytic filtration, and circulation from a reservoir system to the container 307 are most preferable. During the ECMD, the distance $h_{gap}$ between the front surface 203 of the wafer 200 and the WSID/reflector 302 in FIG. 11D may range between 0.001 to 6 mm, but most preferably between 0.002 to 4 mm.

Figure 14:
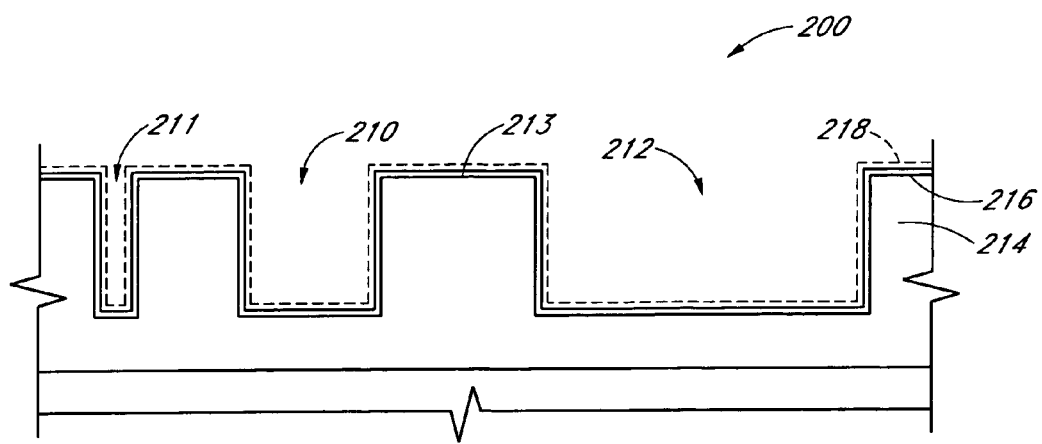
FIGS. 14–18 illustrate cross-sectional views of the exemplary wafer of FIG. 7 being subjected to various stages of radiation assisted deposition according to aspects of the present invention.
Figure 15:
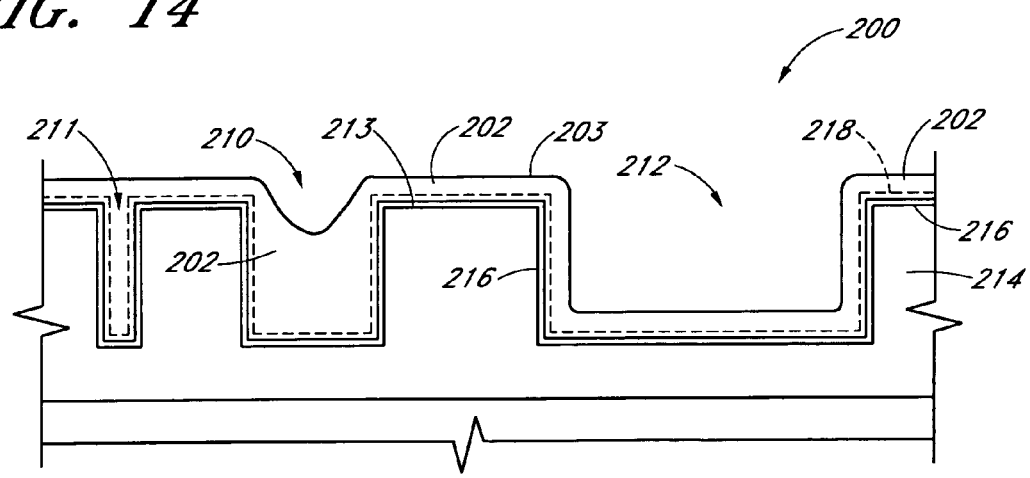

An exemplary radiation assisted ECMD operation according to aspects of the present invention is shown in FIGS. 14–18. FIG. 14 illustrates a cross-sectional view of the exemplary wafer 200 prior to deposition of copper onto the top surface 203 and into the features 211, 210, 212 of the wafer 200. The features are separated from one another by field regions 213 which are the top surface of the dielectric layer 214. For planar deposition, for example a non-radiation assisted copper deposition as described above briefly occur as copper layer 202 onto seed layer 218 and barrier layer 216 to fill up all the smallest features such as features 211, as shown in FIG. 15, further preferably using super filling additives in the solution 314, after which the one or more radiation sources 312 are activated.

Figure 16:
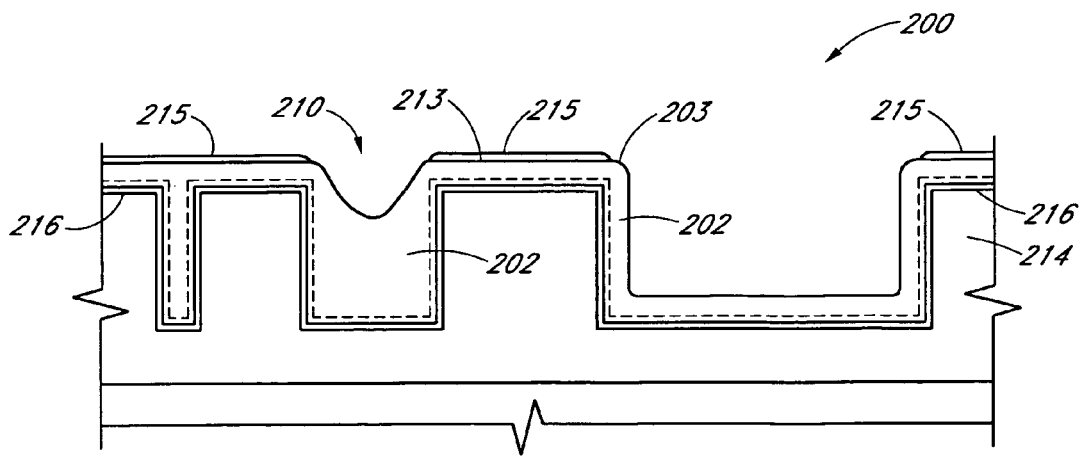

The one or more radiation sources 312 momentarily enhance the adsorption of certain additive molecules in the solution 314 to form a protective layer or an adsorbate material layer 215 on the field regions 213 of the surface of the workpiece, especially in presence of electric field arising from the applied potential difference. FIG. 16 illustrates the optically activated or enhanced adsorbate material layer 215 on the field regions 213 at the front surface 203 of the wafer 200. This optical adsorbate material layer 215 leads to the strong suppression of metal deposition at the front surface of the wafer 200, while deposition is encouraged and accelerated into the recesses or remaining unfilled features 210, 212 in the wafer 200.

Figure 17:
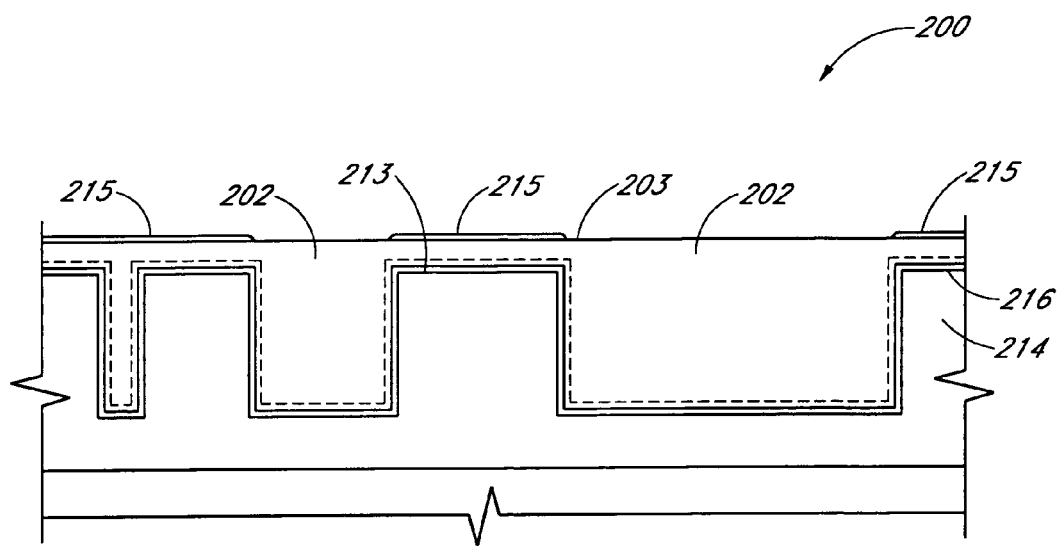
Figure 18:
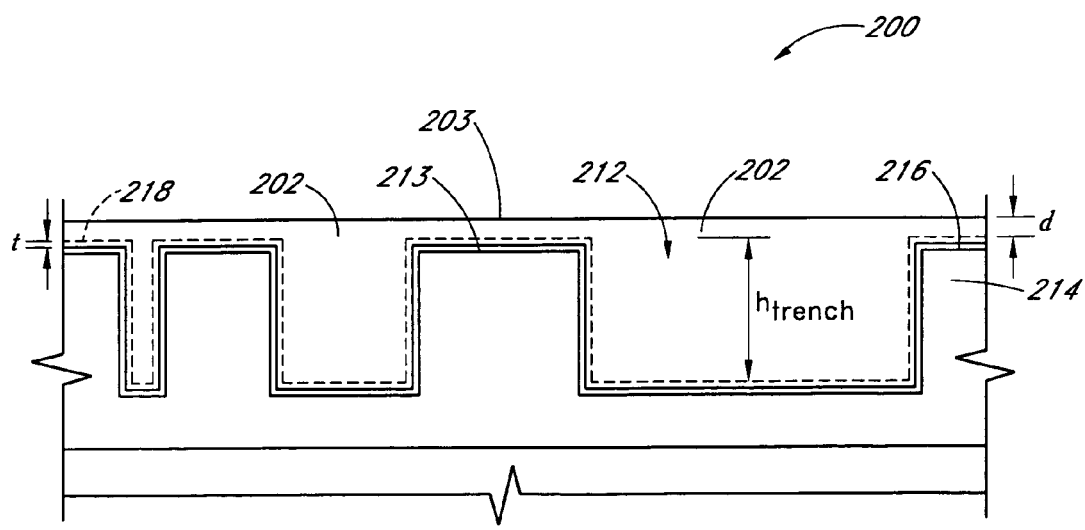

FIG. 17 illustrates a further stage of radiation enhanced metal deposition at which a planar metal deposit on the wafer 200 is achieved. Once a desired planarity or a desired level of planar metal layer is achieved, the one or more radiation sources 312 can be turned off. The radiation provided by the radiation sources 312 develops a planar surface profile for the wafer 200 in the absence of an abrasive surface on the WSID 302. It is understood that the one or more radiation sources 312 may be, for example, pulsed on and off during metal deposition onto the wafer 200. Regardless, once the exciting source or wavelength is removed or turned off, after a short period, the adsorbate molecules or material 215 relaxes and mostly dissolve back to the solution, thus exposing the copper layer underneath, as illustrated in FIG. 18. Pulsing provides advantages especially during material removal. When the light is turned off, protective layer is removed which exposes underlying copper, and when the light is turned on, electropolishing is performed.

The planar overburden thickness d of FIG. 18 is fully tunable using the radiation-assisted deposition according to the present invention. For instance, the planar overburden thickness d may range from a fraction of the thickness t of the seed layer 218 to many multiples of the thickness t of the seed layer. For example, the planar overburden thickness d may range from t/10 to 20t, but preferably between t/3 to 4t. Thus, for a wafer 200 such as planar insulator 214 having one micron deep trench 212, with feature width ranging from 0.03 to 2000 microns, the nominal field seed layer 218 thickness t may be about 100 nanometers (nm). Thus, the depth of the widest trench ($h_{trench}$) is about 10 times the seed layer 218 thickness t=($h_{trench}$/10). After optically assisted planar deposition, the planar overburden thickness d may range between 20 nm to 500 nm. This is only about 0.2 to 5 times the thickness t of the seed layer 218, or around 0.05 to 0.5 the depth of the widest trench $h_{trench}$. This is in sharp contrast to conventional deposition processes that would typically require about 1.5 microns of copper overburden in the field to completely fill all the features on the wafer or workpiece. This is equivalent to 15 times the thickness t of the seed layer 218, that is, 15t; or 1.5 times the depth of the widest trench $h_{trench}$, that is, 1.5$h_{trench}$. Apart from material waste, comparing the removal of 5t to 16t worth of copper overburden that would need to be removed in the subsequent processing step, the variation of overburden across the wafer 200 presents its own type of difficulties, as noted above.

Figure 19:
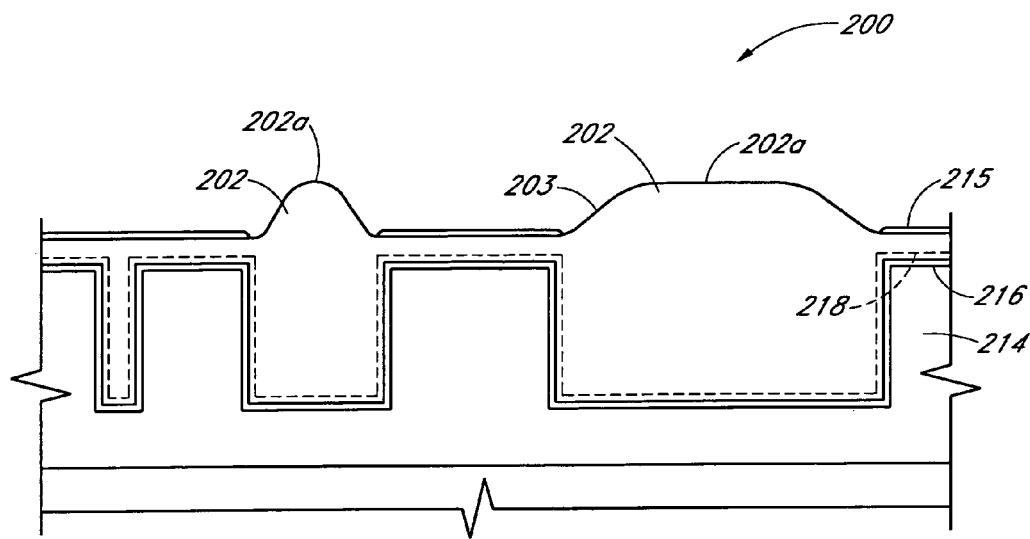
FIG. 19 illustrates a cross-sectional view of the exemplary wafer of FIG. 7 being subjected to radiation assisted deposition with resulting local overplate over the larger features.

In other applications, the presently preferred embodiment can exploit judicious combinations of radiation wavelength, radiation intensity, and cycling (that is, on-off) frequency from the one or more radiation sources 312 to obtain particular results, such as local over plate as illustrated in FIG. 19. FIG. 19 illustrates a local over-plate 202a obtained over the comparatively large features 210, 212 of the wafer 200. Local over-plate 202a in large feature can be tailored such that dishing of the metal is minimized to below 300 Å.

Figure 20:
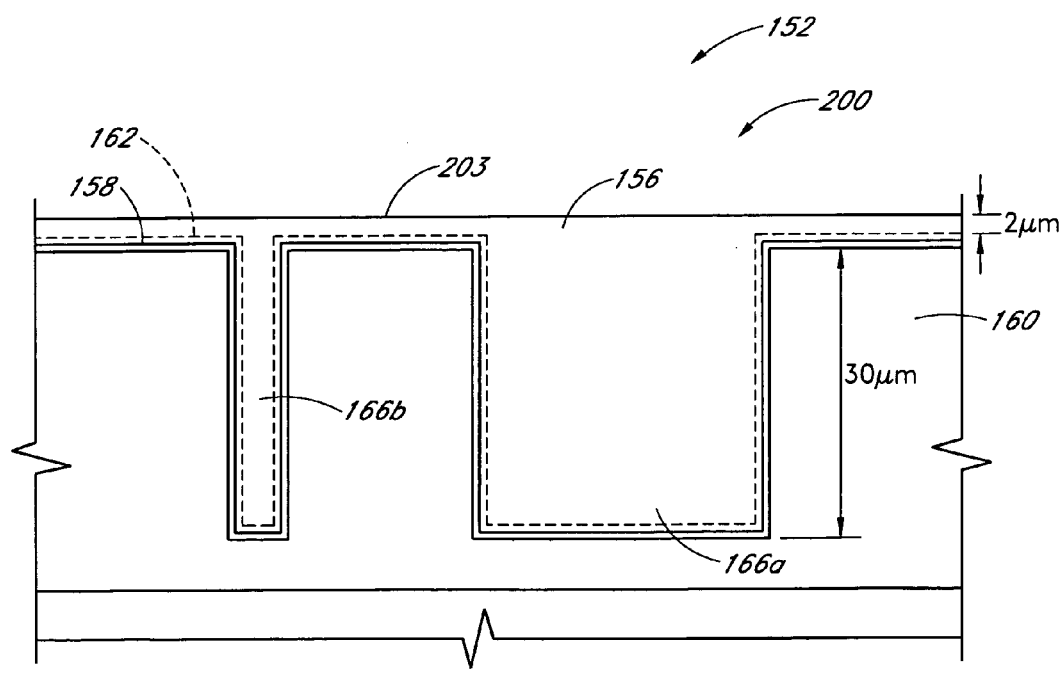
FIG. 20 illustrates a cross-sectional view of the exemplary workpiece of FIG. 5 and resulting relatively minimal planar overburden after being subjected to radiation assisted metal deposition according to an aspect of the present invention.

Of particular interest are the challenges posed by deep to very deep trench plating applications. The exemplary workpiece 152 of FIG. 5 discussed in detail above is a case in point. As described above and shown in FIG. 6, performing conventional damascene plating on the 30 micron deep trench 166a results in very long plating times and, for example, a very expensive CMP copper removal process. By contrast, radiation assisted, for example, optically enhanced, planar metal deposition when applied to a workpiece similar to workpiece 152 having a very deep and wide trench 166a would require at least 10 times less metal deposit, as shown in FIG. 20, comparing an planar overburden thickness of 2 microns with the overburden of 35 microns shown in FIG. 6.

Preferably, radiation assisted material deposition is performed with the WSID/reflector 302 (or WSID 402) positioned as close to the front surface 203 as possible until the features such as trenches and vias are filled with copper. This distance $h_{gap}$ (see FIG. 11D for example) is minimized so that there will be a differential in terms of the radiation seen at the front surface 203 of the wafer 200 and that seen at the full depth of the features. According to aspects of the present invention, a differential between how the radiation is affecting the front surface 203 and the features is exploited. If the WSID/reflector 302 is positioned too far away from the front surface 203, the differential is less significant. The feature depth thus should not be small relative to the distance between the WSID/reflector 302 and the front surface 203.

This close proximity between the WSID/reflector 302 and the front surface 203 during radiation assisted ECMPR can be termed the contact stage. For example, radiation assisted ECMD plating will typically be performed in the contact stage until the features on the front surface 203 are filled.

Figure 21:
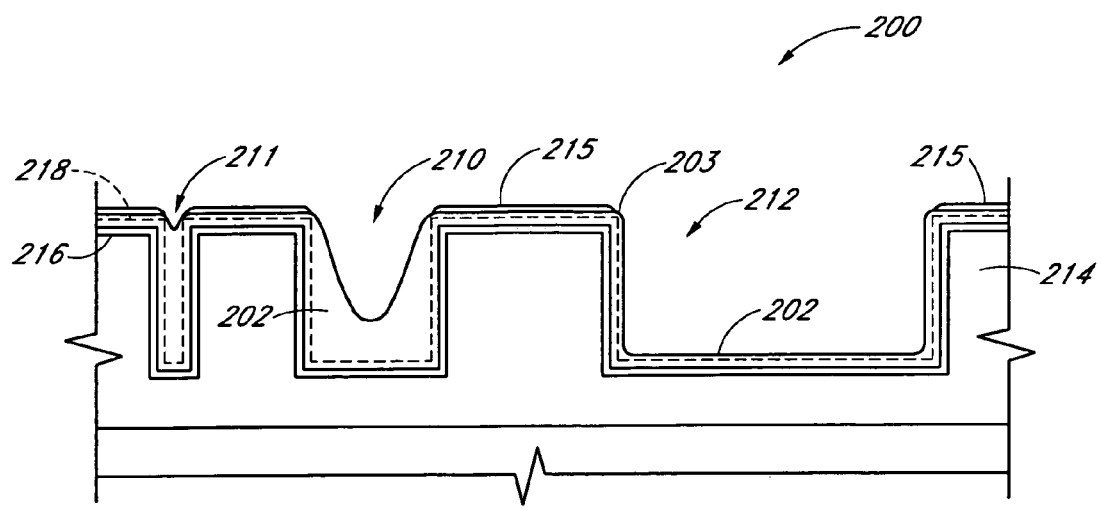
FIGS. 21–24 illustrate cross sectional views of radiation assisted electrochemical deposition according to aspects of the present invention.
Figure 22:
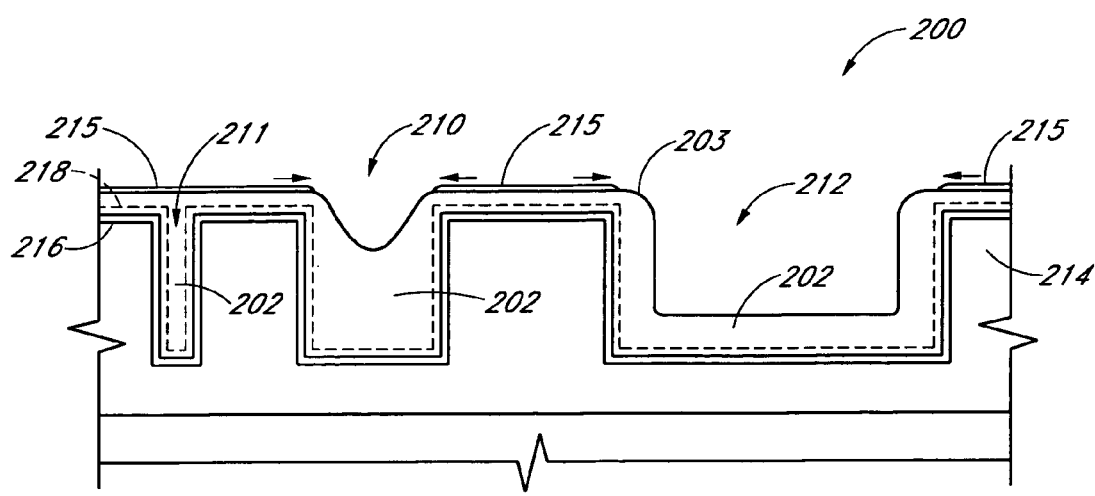

Further, according to the principles of the present invention, an optically activated self-limiting material deposition process having unique efficiencies may thus be used. In this method, the surface 203 of the wafer 200 is moved sufficiently close to the WSID 402 or WSID/reflector 302, such as a glass plate having channels as described above. With judicious choice of radiation wavelength and intensity at the one or more radiation sources 312 as well as choice of wafer 200 surface 203 to WSID 402, 302 spacing, then during metal deposition the optically enhanced adsorbate material layer 215 spreads laterally during the deposition process to fully define deposit profile, i.e. a self-planarization at the surface. FIG. 21 illustrates the optically enhanced adsorbate material layer 215 and profile evolution of the metal layer 202 at the initial stage of metal deposition, for instance, after initially applying a current density of 20 mA/cm$^2$ for 30 seconds. The adsorbate essentially confines deposition to within the features 211, 210, 212. At a further stage of the radiation assisted deposition, after about 75 s, as shown in FIG. 22, the smallest feature 211 is filled, and the adsorbate material layer 215 (or the adsorbate molecules) migrates laterally to cover all the planar portions of the wafer 200, so that the as the portion of the wafer 200 surface 203 that is covered by the adsorbate material layer 215 increases, the deposition voltage in the constant current source increases.

Figure 23:
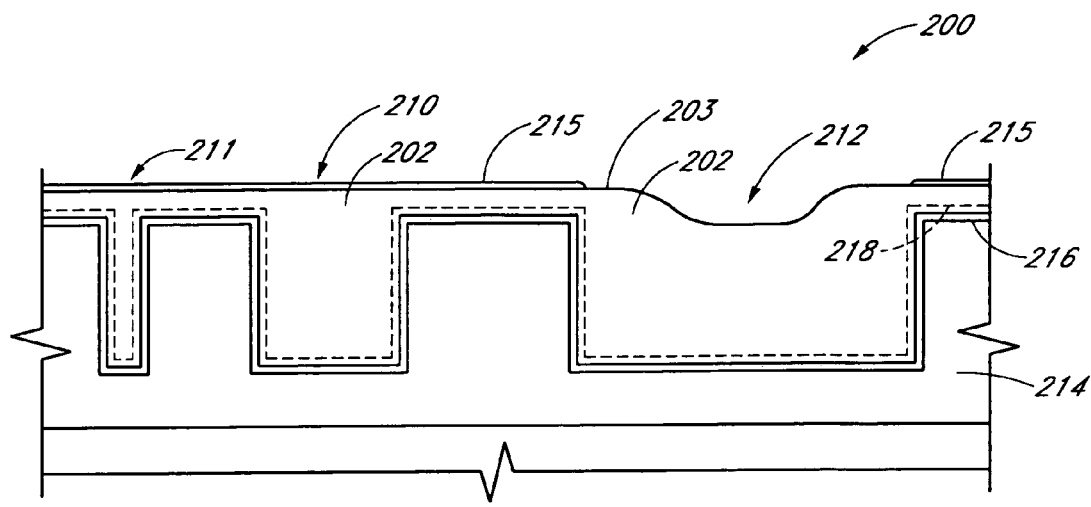
Figure 24:
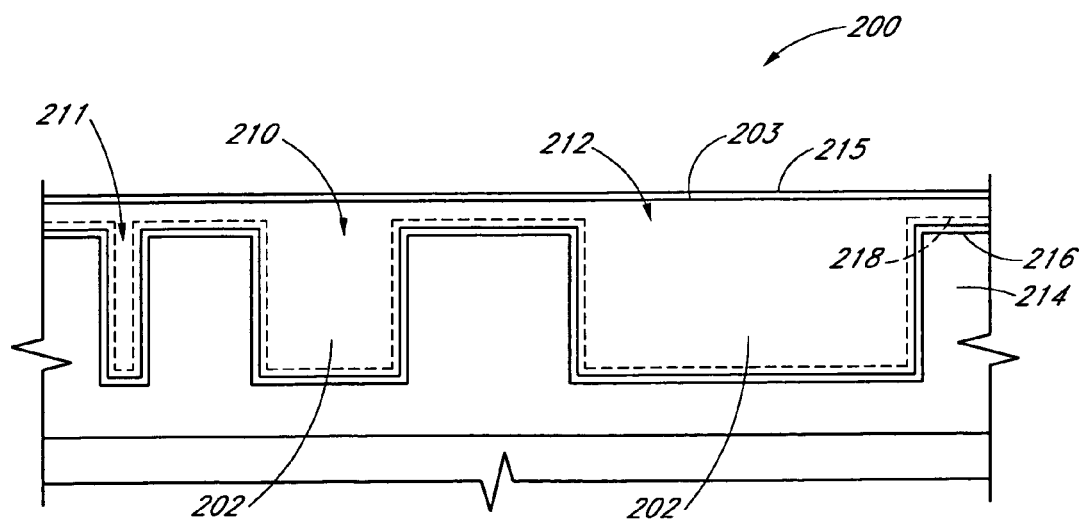

FIG. 23 illustrates a further, intermediate stage in the deposition and self-planarization processes by which point the features 211, 210 with intermediate sizes features are filled, and the planar surface is even further covered by the adsorbate layer 215, with the resulting increase in voltage. In the final stage of profile evolution, shown in FIG. 24, a fully planar profile is realized so that the planar surface is thus covered by the adsorbate material layer 215. Any further metal deposition requires copper ions to diffuse through the adsorbate material layer 215. Such diffusion would require additional work, thus increasing the level of plating voltage needed to deposit the metal. However, when the one or more radiation sources 312 are turned off, or the intensity thereof is sufficiently lowered, the adsorbate material layer 215 may relax and disperse into the electrolyte solution 314 by convection and agitation forces. Thus, the profile limiting adsorbate material layer 215 may be mechanically disturbed or removed and conventional non radiation assisted ECMD process on the planar layer continued.

For material deposition, the adsorbate material layer forms outside of the topographical features at the field region, i.e. the surface of the workpiece. Material deposition is suppressed or at least decelerated at the surface outside of the features. By virtue of charge conservation, material deposition is encouraged into the features i.e., for the same plating charge, more material will be deposited into the features as the plating at the surface outside of the features is suppressed. As the features are filled with material and the surface of the workpiece is increasingly covered by the adsorbate layer, the plating voltage will successively increase because progressively more voltage will be needed to deposit material onto the workpiece surface, i.e. deposition would be less effective at the lower voltage.

Conversely, for material removal applications, polarities are reversed, and, following contact of the surface of the workpiece and the WSID 402 or WSID/reflector 302, the adsorbate material layer 215 at the field region, i.e. at the surface of the workpiece 203 is removed, while those over the cavities or depressions is intact. Material removal is suppressed or at least decelerated within the features because of the adsorbate material layer 215. By virtue of charge conservation, material removal is encouraged at the surface outside of the features, that portion of the workpiece surface that contacted the surface of the WSID 402, 302. For the same plating charge or voltage, more material will be removed at the surface outside the features as the material removal at the features is suppressed.

Figure 25:
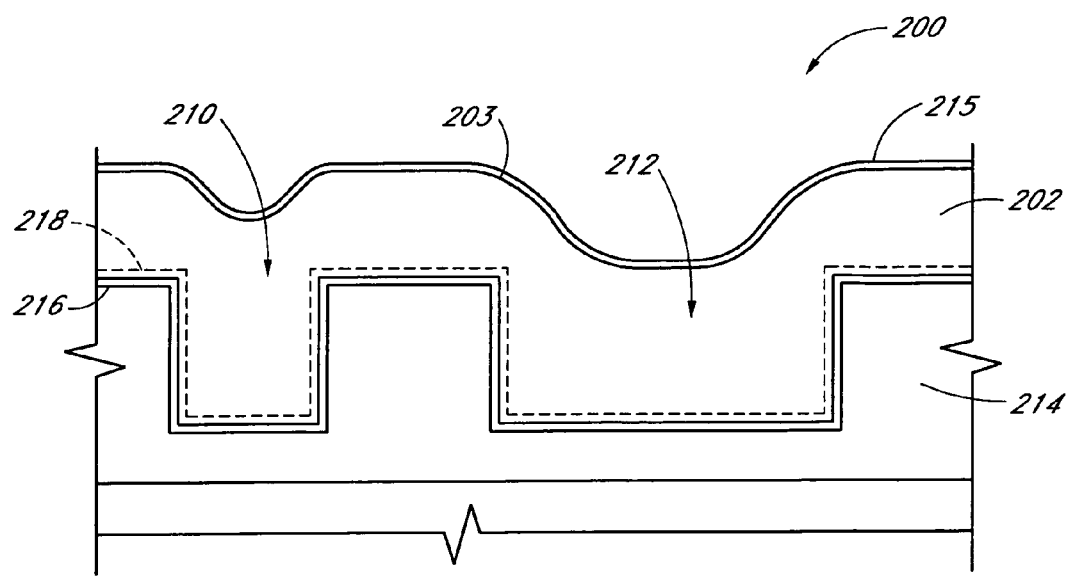
FIGS. 25–26 illustrate cross sectional views of radiation assisted electrochemical material removal according to aspects of the present invention
Figure 26:
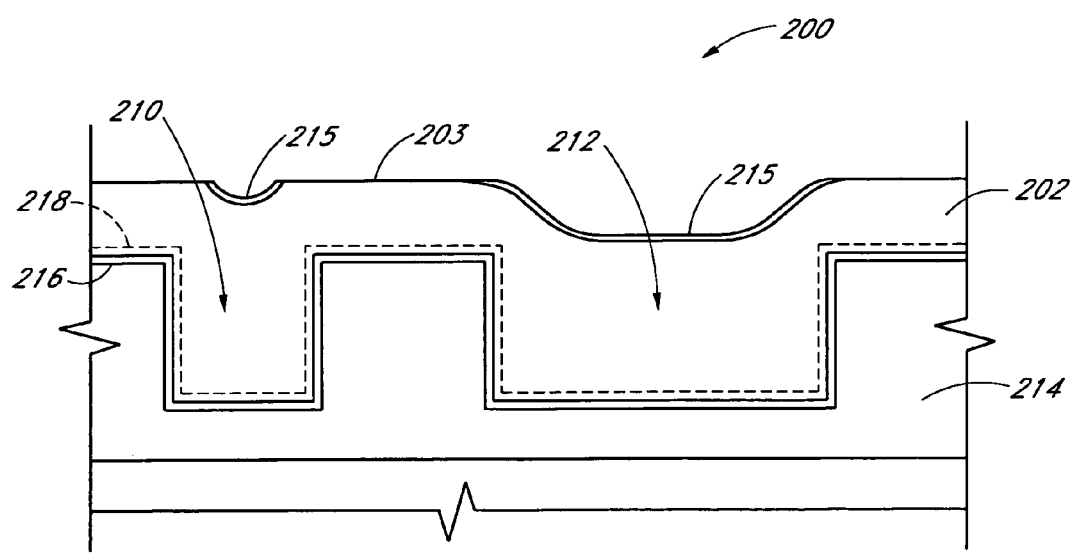

In some embodiments according to aspects of the present invention, the front surface 203 of the wafer 200 is brought sufficiently close to the surface of the WSID 302, 402 during the optically assisted deposition process. The front surface 203 may touch the surface of the WSID 302, 402 momentarily or at various intervals during the radiation assisted deposition process. Thus, by modifying the gap $h_{gap}$ between the wafer 200 surface 203 and the surface of the WSID 302, 402, the plating process or material removal process can be modified. By bringing the surface of the wafer in proximity of WSID 302, 402 or by contacting WSID 302, 402, polishing or material removal from a non-planarized surface is achieved. By disposing the wafer 200 close to the WSID 302, 402, the optically enhanced adsorbate layer 215 may cover the non-planar topographic surface of the wafer 200, as shown in FIG. 25. By momentarily touching the front surface 203 of the wafer 200 to the WSID 302, 402, the adsorbate layer 215 on the planar portions of the wafer 200 is modified momentarily or removed momentarily. This may allow for higher removal rates at these contact areas than compared to the topographic recess portions of the wafer 200. The result is illustrated in FIG. 26 where selective radiation assisted metal removal is seen in the field portion of the front surface 203 where the surface 203 was modified by touch or close proximity to the WSID 302, 402. These high selective removal rates at the top portions of the deposit surface 203, produce a net planar surface or surface with minimal topographic features similar to those illustrated in FIGS. 18 and 20. The planar surface may then be removed very uniformly with or without the help of optical radiation.

Electromagnetic radiation sources 312 may be used to enhance the removal of a material such as metal from a workpiece surface during a CMP process. For example, during a CMP step, intense radiation is reflected from the reflector 302, 406 to the interface of the wafer 200 and the WSID, for example, a pad, in the presence or absence of an abrasive in the electrolyte solution to enhance the removal rate of the metal at polishing pressures less than 0.5 psi. This very lower pressure CMP process is very beneficial in the polishing low and ultra low K materials. The slurry may be aqueous or non-aqueous in nature. For example, an intense radiation may be used to raise the temperature of the wafer 200/slurry/WSID interface to increase the polishing rate at low pressures during the initial and intermediate states of material planarization. The one or more radiation sources providing the radiation to the reflector 302, 406 may be turned off or pulsed to moderate or reduce removal rates toward the final stages of the CMP processes. Alternatively, selective wavelength portions of the radiation spectrum may be used during the various stages of the CMP process. The CMP pad may or not be optically transmitting. For opaque pads, the radiation can be couple through the electrolyte or slurry to the workpiece and pad surface. Further, the radiation may be coupled to one or more channels formed through the pad.

In other embodiments, electric field may be coupled with electromagnetic radiation during the CMP process. In this case, the workpiece surface is rendered anodic during the process. Also, portions of the radiation reflected from the workpiece may be analyzed to monitor the progress of the removal step, including the final end point. For example, a portion of radiation reflected or emanating from the wafer 200/slurry/pad interface may be analyzed interferometerically to obtain optical micrometric information for CMP end point determination. Also similar detection scheme may be used in metal deposition and removal process for example, optical micrometric information. For example from the onset of metal deposition through the evolution of metal planarizations to complete planar surface can be acquired and used for process control. Further, optical micrometer or differential optical micrometer (with resolution less than 100 Å) using LED light sources and linear CCD (charge coupled diodes) sensors may be used to detect endpoint during metal planarization or during metal CMP. For example, in the case of copper plating and planarization, damascene type structures such as the workpieces 102, 152 of FIGS. 1 and 5, respectively, may be completely plated with planar metal layers according to aspects of the present invention, as shown in FIGS. 18 and 20. The interferometric arrangement can be configured to detect the planarization endpoint after the planarization step. As the deposited film is rendered anodic and its electrolyte is used as a polishing fluid, metal removal may then be accomplished while the workpiece is touching or not touching the WSID surface. The optical micrometric method may be used to monitor the metal removal process to endpoint on the barrier layer surface or endpoint with a very thin copper layer preferably some fraction of the analyzing wavelength i.e., $\lambda/n$, where n is a real number or an integer. Thus, a copper planar overburden layer thinner than the original seed layer t, i.e., 20 nm, or small multiples of the seed layer, like 1.5 t can be achieved. In this case, the thickness of the deposited film is only 0.5 t (where t is the original seed layer thickness).

The endpoint detection apparatus such as the interferometric arrangement described with reference to CMP can be, for example, the light sources and sensors such as described in, for example, U.S. Application Ser. No. 10/017,494 entitled "Planarity Detection Methods and Apparatus for Electrochemical Mechanical Processing Systems," filed on Dec. 7, 2001. To complete radiation assisted ECMD process, light sources such as the one or more additional radiation sources 332 shown in FIG. 13A can be focused on an edge of the front surface 203 of the wafer 200 so that one or more respective sensors can be mounted to sense planarization endpoint by measuring, for example, the intensity of the light reflected from the respective one or more sources 332 as material is deposited or removed.

The radiation sources, such as the one or more radiation sources 312, according to aspects of the present invention and in the case of, for instance, ultra-violet radiation sources, may be pulsed, cyclically or non-cyclically, for brief intervals of a small fraction of the deposition times. The pulsing may occur one or more times during the deposition or the removal steps, or both. Similarly, the intensity of the radiation may be altered cyclically or non-cyclically during the deposition or the removal processes, or both. For instance, the intensity of the ultra-violet source may be altered one or more times during the deposition or removal steps, or both. Besides modifying the on/off cycle of the one or more radiation sources, the choice of wavelength and wavelength ranges may be altered during the material deposition or removal steps or both. For instance, the deposition step may be initiated with ultra-violet radiation, and later in the process, to enhance the desorption of the adsorbate material layer from the field region of the workpiece, or to form one or more intermediate beneficial molecules or complexes, infra-red portions of the one or more radiation sources may be used.

In some plating additive systems, it is preferable to minimize additive degradation by maintaining the plating bath reservoir or container 307 at a temperature below 15° C., but preferably below 10° C. However, optimum super leveling may occur between 23 to 30° C., a temperature where additive consumption or degradation is very high. By use of an optically enhanced plating process, for instance, infra-red portions of the one or more radiation sources may be used to maintain the wafer 200 at the optimum bath condition, to obtain optimum deposition condition and deposit properties, while maintaining the temperature of the bulk electrolyte solution 314 at a much lower desirable temperature. Thus, the workpiece/electrolyte interface or boundary layer can be at a temperature higher than the bulk of the electrolyte 314. In FIG. 11C, for example, the bulk of the electrolyte solution 314 in container 307 is maintained at a lower temperature by use of a chiller attached to the temperature control unit 334. Apart from thermal effects, the optical micro and nano-stirring of the metal-electrolyte interface, dramatically thins the fluid boundary layer, which helps replenishment of ions at the metal surface. As a consequence, very high speed, high quality material deposition or removal can be easily accomplished.

Further, it is preferable that the plating bath chemistry contain additives that may interact with electromagnetic radiation. For example, the radiation emanating from the reflector 302, 406 changes the molecular polarizability of some of the additive molecules to enhance adsorption or desorbtion from the front surface 203 of the wafer 200. In another example, besides heating the workpiece/electrolyte interface, one or more ultra-violet or infra-red radiation source may be used to momentarily change the permanent dipole of some of the additive molecules during the metal plating or metal removal process. Further, the radiation may not raise the additive molecules to any particular quantized level, some of the additive molecules may be in a virtual or quasi excited state. This may improve additional adsorption to the cathodic sites.

It is to be understood that in the foregoing discussion and appended claims, the terms "workpiece surface" and "surface of the workpiece" include, but are not limited to, the surface of the workpiece prior to processing and the surface of any layer formed on the workpiece, including conductors, oxidized metals, oxides, spin-on glass, ceramics, etc. The electrolyte may be aqueous, non-aqueous, a gel electrolyte, a solid or molten electrolyte. The workpiece may be planar without topographic features. Apart from copper and its alloys, other metals can be plated, etched or polished using the present invention. Other metals may comprise, but not limited to, platinum, precious metals, nickel, tungsten, rhodium and their alloys. Also insulating, semiconducting materials may be removed by the method of the invention.

Although various preferred embodiments have been described in detail above, those skilled in the art will readily appreciate that many modifications of the exemplary embodiment are possible without materially departing from the novel teachings and advantages of this invention.

What is claimed is:

1. A method of removing a conductive material from a surface of a workpiece that contains a plurality of recesses, the method comprising:

performing removing the conductive material from the surface of the workpiece; and while performing is occurring, directing radiation from a radiation source toward the surface of the workpiece to alter adsorptive properties of the conductive material in certain portions of the surface as compared to other portions of the surface, wherein the certain portions are at least some of a top surface area without recesses, the other portions are at least some of the plurality of recesses, conductive material is removed on the certain portions at a greater rate than at other portions, and directing radiation results in an adsorbate material layer forming at the surface of the other portions.

2. The method of claim 1, further comprising establishing a potential difference between the surface of the workpiece and an electrode during removing the conductive material from the surface of the workpiece while a process solution touches both of them.

3. The method of claim 1, wherein processing comprises electrochemical mechanical processing.

4. The method of claim 3, wherein processing comprises electrochemical mechanical polishing.

5. The method of claim 1, further comprising depositing the conductive material onto the surface of the workpiece while removing the conductive material from the surface of the workpiece.

6. The method of claim 5, wherein depositing the conductive material onto the surface of the workpiece comprises electrochemical mechanical deposition.

7. A method of forming a conductive layer on a conductive surface of a workpiece, the method comprising:

irradiating a radiation onto the conductive surface of the workpiece, the conductive surface having a top surface area and at least one cavity having all surfaces lined with the conductive surface during irradiating, wherein irradiating the radiation results in a protective material layer forming at the top surface area of the conductive surface at a greater rate than a rate of forming the protective material layer in the at least one cavity; and during irradiating, processing the conductive surface of the workpiece.

8. The method of claim 7, wherein the step of processing comprises the step of depositing conductive material into the at least one cavity at a greater rate than the top surface of the conductive layer.

9. The method of claim 7, wherein the step of processing comprises the step of removing conductive material from the top surface of the conductive layer while disturbing the protective layer on the top surface of the conductive layer.

10. The method of claim 9, wherein disturbing the protective layer is performed by bringing the top surface of the conductive layer into contact with a workpiece surface influencing device (WSID).

11. The method of claim 7, wherein processing comprises electrochemical mechanical processing.

12. The method of claim 11, wherein processing comprises electrochemical mechanical polishing.

13. The method of claim 7, further comprising providing the workpiece with the conductive surface, having the top surface area and the at least one cavity with all surfaces lined with the conductive surface, prior to irradiating the radiation.

14. A method of performing radiation assisted material removal at a surface of a workpiece, the surface having topographical features, the method comprising:

directing radiation from a radiation source through a workpiece surface influencing device (WSID) and toward the surface of the workpiece to enhance adsorptive properties of a material at a field region at the surface of the workpiece so that removal of the material along the field region is confined to outside of the topographical features and is suppressed at the topographical features by an adsorbate material that forms within the topographical features;

bringing the surface of the workpiece into contact with the WSID prior to the step of directing; and removing material from the surface of the workpiece in the presence of an applied potential difference and a solution, the solution being communicated through a plurality of channels in the WSID to the surface of the workpiece.

* * * * *